US012754578B2

(12) United States Patent
Ueda et al.

(10) Patent No.: US 12,754,578 B2
(45) Date of Patent: Oct. 6, 2026

(54) CURRENT DETECTION CIRCUIT AND POWER SUPPLY SEMICONDUCTOR INTEGRATED CIRCUIT

(71) Applicants: Yuichi Ueda, Ebina (JP); Yoshiki Takabatake, Yokohama (JP)

(72) Inventors: Yuichi Ueda, Ebina (JP); Yoshiki Takabatake, Yokohama (JP)

(73) Assignee: MITSUMI ELECTRIC CO., LTD., Tokyo (JP)

( * ) Notice: Subject to any disclaimer, the term of this patent is extended or adjusted under 35 U.S.C. 154(b) by 142 days.

(21) Appl. No.: 18/937,079

(22) Filed: Nov. 5, 2024

(65) Prior Publication Data

US 2025/0147531 A1 May 8, 2025

(30) Foreign Application Priority Data

Nov. 8, 2023 (JP) ................................ 2023-190903

(51) Int. Cl.
*G05F 1/56* (2006.01)
*G01R 19/00* (2006.01)
*G05F 1/565* (2006.01)

(52) U.S. Cl.
CPC ......... *G05F 1/565* (2013.01); *G01R 19/0092* (2013.01); *G05F 1/561* (2013.01)

(58) Field of Classification Search
CPC ..... G05F 1/00; G05F 1/10; G05F 1/12; G05F 1/46; G05F 1/455; G05F 1/45; G05F 1/445; G05F 1/66; G05F 1/40; G05F 1/42; G05F 1/44; G05F 1/462; G05F 1/52; G05F 1/56; G05F 3/10; G05F 3/16; G05F 3/18; G05F 3/185; G05F 3/20; G05F 3/26; G05F 3/30; G05F 3/205; G05F 3/22; G05F 3/24;
(Continued)

(56) References Cited

U.S. PATENT DOCUMENTS 4,598,350 A * 7/1986 Sakai ........................ H02J 3/36
363/35
6,728,495 B1 * 4/2004 Miki .................... H04B 10/564
398/23

(Continued)

FOREIGN PATENT DOCUMENTS

JP 2017-045096 A 3/2017
JP 2023-043049 A 3/2023

*Primary Examiner* — Jeffrey A Gblende
(74) *Attorney, Agent, or Firm* — Shih IP Law Group, PLLC.

(57) ABSTRACT

Disclosed is a current detection circuit including: a current-to-voltage converter; a comparator including one input terminal to which a voltage that is current-to-voltage converted is input and the other input terminal to which a voltage as a reference for comparison or a voltage converted from the current to be detected is input; and a hysteresis circuit. The hysteresis circuit includes: a current source circuit; and a switch connected in series with the current source circuit, and the switch is switched to an on state or an off state by output of the comparator, thereby a current flowed in the current-to-voltage converter is increased or decreased by the current of the current source circuit, and the voltage converted from the current to be detected or from the reference current changes and thereby the hysteresis circuit provides hysteresis to the comparison operation of the comparator.

7 Claims, 8 Drawing Sheets

(58) Field of Classification Search
CPC .......... G05F 3/222; G05F 3/242; G05F 3/225; G05F 3/227; G05F 3/245; G05F 3/247; G05F 3/262; G05F 3/265; G05F 3/267; G05F 1/575; G05F 1/565; G05F 1/561; H02M 5/2573; H02M 1/081; H02M 5/293; H02M 7/12; H02M 3/10; H02M 3/125; H02M 3/13; H02M 3/135; H02M 3/145; H02M 3/15; H02M 3/155; H02M 3/156; H02M 3/157; H02M 3/158; H02M 1/346; H02M 3/1588; H02M 2003/1566; H02M 3/1582; H02M 3/1584; H02M 2003/1557; H02M 1/0032; H02M 1/4225; H02M 7/217; H02M 1/0025; H02M 1/0045; H02M 1/0009; H02M 1/08; H02M 1/088; H02M 1/0048; H05B 39/048; B23K 11/24; H04B 2215/069
See application file for complete search history.

(56) References Cited

U.S. PATENT DOCUMENTS 11,205,959 B2 * 12/2021 Takada .................. H02M 3/156
11,436,383 B2 * 9/2022 Delshadpour ............ G11C 7/24

* cited by examiner

CURRENT DETECTION CIRCUIT AND POWER SUPPLY SEMICONDUCTOR INTEGRATED CIRCUIT

REFERENCE TO RELATED APPLICATIONS

This application is based upon and claims the benefit of priority from the prior Japanese Patent Application No. 2023-190903, filed on Nov. 8, 2023, the entire contents of which are incorporated herein by reference.

TECHNICAL FIELD

The present disclosure relates to a current detection circuit that detects a large or small current using a comparator and a power supply semiconductor integrated circuit (power supply IC) incorporating the current detection circuit, and relates to a technique that is effective for use in a power supply semiconductor integrated circuit having a plurality of output terminals to which a load is connected and using a current detection circuit to detect an open error or short error of the plurality of output terminals or load, for example.

DESCRIPTION OF RELATED ART

In automobiles equipped with terrestrial digital (terrestrial digital TV broadcasting) tuners, an in-vehicle regulator supplies power to on-board electronic devices such as antennas for terrestrial digital broadcasting. In in-vehicle terrestrial digital tuners that support full-segment broadcasting, diversity antennas, which are equivalent antennas for four channels, are generally used as antennas for terrestrial digital broadcasting to optimize reception situations by adjusting reception sensitivity and switching between full-segment and one-segment broadcasting at the tuner.

On the other hand, since in-vehicle tuners and antennas are connected to the in-vehicle regulator via connectors, vibration of the vehicle body can cause the connectors to disconnect and open the output terminals of the power supply, or cause a wire break or a short-circuit (short) inside the load. For this reason, some in-vehicle regulators are equipped with a function to detect such error states.

Conventionally, inventions related to semiconductor integrated circuits for regulators (IC for regulators) configured to detect an open or short state of an output terminal, generate an error detection signal, generate an error detection signal and output the signal from the output terminal are described in JP-A-2017-45096 and No. JP-A-2023-43049.

Both the JP-A-2017-45096 and JP-A-2023-43049 inventions are configured as regulators that can supply power for two channels (2ch). Among these, the invention in JP-A-2017-45096 allows the threshold for error detection to be set separately from the two external terminals corresponding to the two channels. The invention in JP-A-2023-43049 uses a common threshold for error detection for two channels to reduce the number of external terminals for setting the threshold.

In both the JP-A-2017-45096 and JP-A-2023-43049 inventions, the open or short state of the output terminal is detected by using a comparator that compares a voltage proportional to the output current with an externally set threshold voltage and makes determination. Therefore, when the output current increases or decreases near the threshold value due to noise, the comparator output repeatedly changes high or low. To prevent such malfunctions due to noise, it is necessary to provide hysteresis in the comparison operation of the comparator.

Although JP-A-2023-43049 states that a comparator with hysteresis characteristics should be used, it does not disclose the specific configuration for providing hysteresis. Also, in JP-A-2017-45096 and JP-A-2023-43049, examples of regulators composed of MOS transistors are disclosed, and specific examples of regulators composed of bipolar transistors are not disclosed.

SUMMARY OF THE INVENTION

An object of the present disclosure is to provide a current detection circuit capable of providing hysteresis to the comparison operation of a comparator whose detection target is a current, and a power supply semiconductor integrated circuit incorporating the current detection circuit.

Another object of the present disclosure is, in a power supply semiconductor integrated circuit having a current detection circuit that detects an open state or a short state of an output terminal using a comparator and composed of a bipolar transistor, to prevent a transistor constituting a hysteresis circuit in the current detection circuit from operating in the saturation region.

In order to achieve the above objects, according to an aspect of the present disclosure, there is provided a current detection circuit including:

a current-to-voltage converter that converts a current to be detected or a reference current into a voltage;

a comparator including one input terminal to which a voltage that is current-to-voltage converted by the current-to-voltage converter is input and the other input terminal to which a voltage as a reference for comparison or a voltage converted from the current to be detected is input; and a hysteresis circuit for providing hysteresis to a comparison operation of the comparator, wherein the hysteresis circuit includes:

- a current source circuit that generates a current of a predetermined magnitude; and
- a switch connected in series with the current source circuit, and the switch is switched to an on state or an off state by an output of the comparator, thereby a current flowed in the current-to-voltage converter is increased or decreased by an amount of the current of the current source circuit, and the voltage converted from the current to be detected or the voltage converted from the reference current changes and thereby the hysteresis circuit provides hysteresis to the comparison operation of the comparator.

BRIEF DESCRIPTION OF DRAWINGS

The accompanying drawings are not intended as a definition of the limits of the invention but illustrate embodiments of the invention, and together with the general description given above and the detailed description of the embodiments given below, serve to explain the principles of the invention, wherein.

DETAILED DESCRIPTION

Hereinafter, one or more embodiments of the present disclosure will be described with reference to the drawings. However, the scope of the present disclosure is not limited to the disclosed embodiments.

First Embodiment

Figure 1:
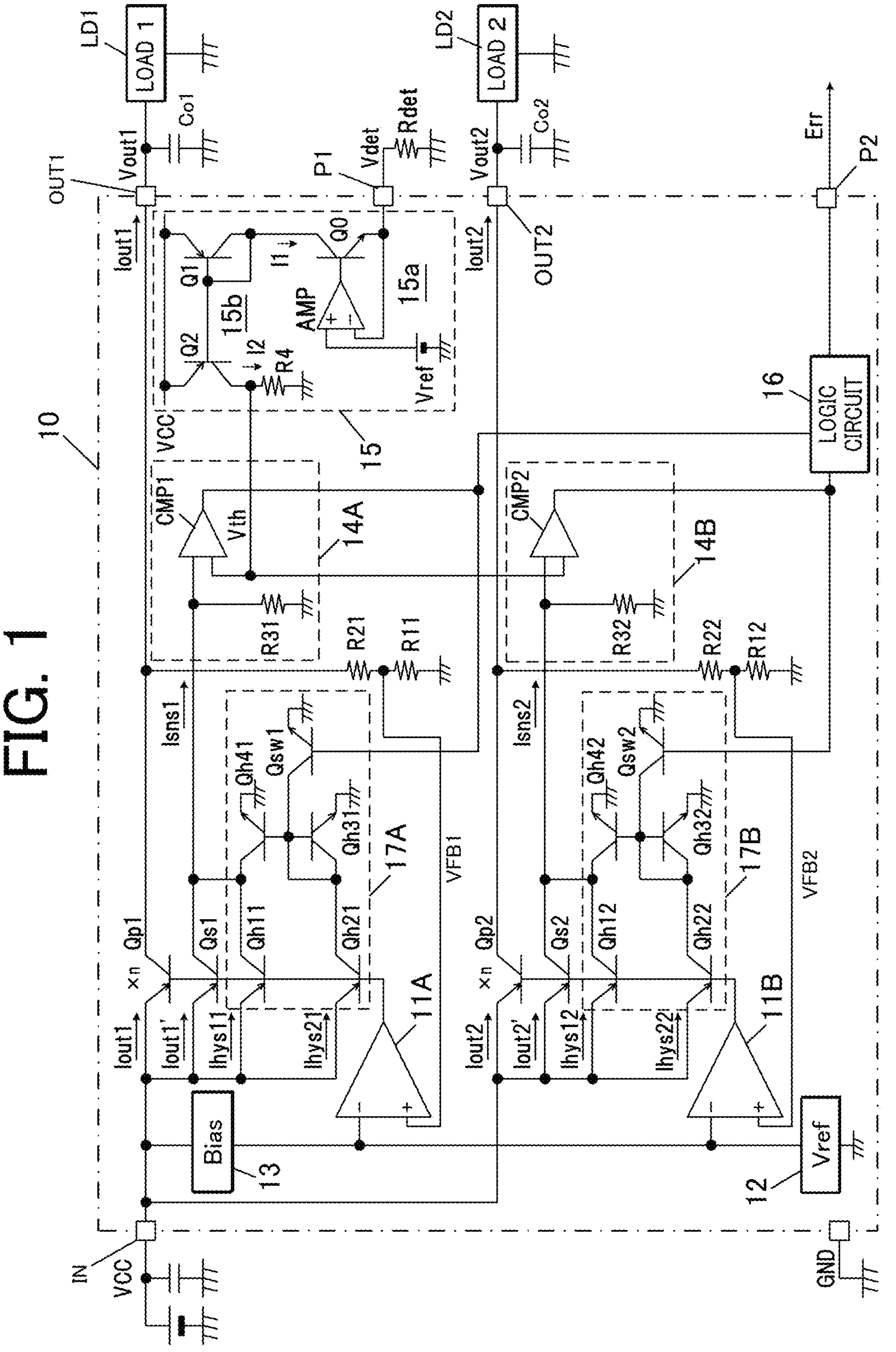
FIG. 1 is a circuit diagram showing a first example of a regulator IC of a first embodiment applying the present disclosure.

FIG. 1 shows the circuit configuration of the first example of the first embodiment when the present disclosure is applied to a series regulator as a DC power supply device as an example. In FIG. 1, the portion surrounded by a single dotted line is formed as a semiconductor integrated circuit (hereinafter referred to as regulator IC) 10 on a semiconductor chip such as single crystal silicon.

In the regulator IC10 of this embodiment, as shown in FIG. 1, one voltage input terminal IN to which a DC voltage VCC is applied and two output terminals OUT1 and OUT2 are provided as external terminals, and PNP bipolar transistors Qp1 and Qp2 are connected between the voltage input terminal IN and each output terminal OUT1 and OUT2, respectively, and capacitors Co1 and Co2 are connected to the output terminals OUT1 and OUT2 to function as a DC power supply device that supplies two stable DC output voltages Vout1 and Vout2 externally. LD1 and LD2 represent load devices such as antennas connected to the output terminals OUT1 and OUT2.

Between the output terminals OUT1 and OUT2 and the ground line to which the ground potential GND is applied, resistors R11 and R12 and resistors R21 and R22 are connected in series to divide the output voltage Vout1 and Vout2, respectively. R11, R12, R21 and R22 can be provided outside the regulator IC10 if a separate external terminal connected to the midpoint between resistors R11 and R12 or R21 and R22 is provided.

The voltage VFB1 divided by the resistors R11 and R12 for the above output voltage dividing is fed back to the non-inverting input terminal of an error amplifier 11A as an error amplifier circuit controlling the base terminal of the above transistor Qp1, and the voltage VFB2 divided by the above resistors R21 and R22 is fed back to the non-inverting input terminal of the error amplifier 11B that controls the base terminal of the above transistor Qp2. The error amplifiers 11A and 11B control the transistors Qp1 and Qp2 according to the potential difference between the output feedback voltages VFB1 and VFB2 and a predetermined reference voltage Vref, so that the output voltages Vout1 and Vout2 become the desired potential by flowing current according to the load. As a result, transistors Qp1 and Qp2 function as current control elements and voltage control elements.

Furthermore, the regulator IC 10 of this embodiment has a reference voltage circuit 12 for generating a reference voltage Vref applied to the inverting input terminals of the above error amplifiers 11A and 11B, and a bias circuit 13 for flowing an operating current in the error amplifiers 11A and 11B and the reference voltage circuit 12.

The above reference voltage circuit 12 can be composed of a band gap reference circuit, a series of resistors and Zener diodes.

Furthermore, in the regulator IC 10 of this embodiment, transistors Qs1 and Qs2, which constitute current mirror circuits with the above transistors Qp1 and Qp2 for current control respectively, are provided in parallel with the transistors Qp1 and Qp2, and the same voltages as those applied to the base terminals of the transistors Qp1 and Qp2, that is, the output voltages of the above error amplifiers 11A and 11B, are applied to the base terminals as control terminals of these transistors Qs1 and Qs2. This allows currents proportional to the collector currents of Qp1 and Qp2 (1/N current) to flow in Qs1 and Qs2, depending on the size ratio N of the elements.

Furthermore, the regulator IC10 of this embodiment is provided with resistors R31 and R32 as current-to-voltage converters, which are connected in series with the above current mirror transistors Qs1 and Qs2, respectively, and convert the current flowing in Qs1 and Qs2 into voltages. The voltages converted by the resistors R31 and R32 are input to one input terminals of comparators CMP1 and CMP2 and compared with a threshold voltage Vth applied to the other input terminals. Therefore, the resistor R31 and the comparator CMP1 constitute a current detection circuit 14A, and the resistor R32 and the comparator CMP2 constitute a current detection circuit 14B.

Hysteresis circuits 17A and 17B are provided corresponding to the above current detection circuits 14A and 14B to provide hysteresis to the comparison operation of the comparators CMP1 and CMP2 by increasing or decreasing the current flowing in the transistors Qs1 and Qs2 according to the output state of the comparators CMP1 and CMP2. The specific configuration and operation of the hysteresis circuits 17A and 17B will be described in detail later.

There are provided an external terminal P1 for connecting a voltage-current converting resistor Rdet outside the chip, and a voltage converter 15 that generates a voltage Vth in accordance with the voltage Vdet generated at the external terminal P1, and the comparators CMP1 and CMP2 compare the voltage Vth generated by the voltage converter 15 and the voltages converted by the resistors R31 and R32 to detect either an open or short error in the output terminals OUT1 and OUT2. Therefore, the voltage Vth is the threshold for determining an open or short error.

FIG. 1 to FIG. 7 show a circuit configuration that detects either an open or short error as an example of the present disclosure, but it can also be configured to detect both open and short errors in the transistors Qp1 and Qp2.

When the comparators CMP1 and CMP2 are used as open error detection means, to one input terminals (+ or −) of the comparators CMP1 and CMP2, the currents Iout1' and Iout2' of Qs1 and Qs2 are applied through the resistors R31 and R32 to generate voltages, and a threshold voltage Vtho is generated at the other input terminals (− or +).

On the other hand, when the comparators CMP1 and CMP2 are made to function as short error detection means, one input terminals (− or +) of the comparators CMP1 and CMP2 are used to generate voltage by flowing the currents Iout1' and Iout2' of Qs1 and Qs2 in the resistors R31 and R32 to generate voltages, and the threshold voltage Vths is generated at the other input terminals (+ or −).

The inverting/non-inverting input terminals (− or +) of the comparators CMP1 and CMP2, to which Vtho or Vths is input, can be either by the logic of a logic circuit 16 in the subsequent stage. Therefore, in FIG. 1, the "+" or "−" symbols appended to the input terminals of the comparators CMP1 and CMP2 are omitted.

Here, there is a possibility that Vth and Vtho or Vths are limited by the input dynamic range of the comparators CMP1 and CMP2 if they are too high or too low, and if they are too low, the voltage generated across the resistors R4, R31, and R32 will be small, which raises an accuracy issue. Therefore, when the comparators CMP1 and CMP2 are used as open error detection means, since the current flowing through the transistors Qp1 or Qp2 is small, it is desirable that the current mirror ratio m of the transistors Qp1 and Qs1 or the transistors Qp2 and Qs2 are set to be small to make the current flowing through the transistors Qs1 or Qs2 relatively large, so that Vtho does not become too small.

On the other hand, when the comparators CMP1 and CMP2 are used as short error detection means, since the current flowing through the transistors Qp1 or Qp2 is large, it is desirable to set the current mirror ratio m of the transistors Qp1 and Qs1 or the transistors Qp2 and Qs2 to be large and make the current flowing through the transistors Qs1 or Qs2 relatively small, so that Vths does not become too large.

Furthermore, the regulator IC 10 of this embodiment has a logic circuit 16 that takes the outputs of the above comparators CMP1 and CMP2 for error detection as inputs and an external terminal P2 that outputs a signal ERR indicating that the comparators CMP1 and CMP2 detected an error.

In the example shown in FIG. 1, the output of the logic circuit 16 is configured to be output directly from the external terminal P2. However, an NPN bipolar transistor with the output of the logic circuit 16 input to the base terminal and the collector terminal connected to the external terminal P2 may be provided to output an error detection signal ERR to an external CPU or the like in an open collector format. Instead of an open collector type transistor, an output circuit consisting of an emitter follower may be provided.

The above logic circuit 16 is configured as a circuit with an OR logic function if an error state is indicated when the outputs of the above comparators CMP1 and CMP2 for error detection are high level, and it is output as a low level error detection signal ERR. The above logic circuit 16 is configured as a circuit with a NAND logic function if an error state is indicated when the outputs of the above comparators CMP1 and CMP2 for error detection are low level, and it is output as a low level error detection signal ERR. The above logic circuit 16 is configured as a circuit with a NOR logic function if an error state is indicated when the outputs of the above comparators CMP1 and CMP2 for error detection are low level, and it is output as a high level error detection signal ERR.

Furthermore, two external terminals for outputting an error detection signal may be provided to output two-bit error detection signals corresponding to the outputs of the comparators CMP1 and CMP2, respectively, to the outside, in which case the logic circuit 16 can be configured as a delay circuit, for example.

As explained above, in the regulator IC10 of this embodiment, when equivalent loads are connected to the output terminals OUT1 and OUT2, an open or short error can be detected by simply providing one external terminal to which an external resistor Rdet is connected. It also thereby reduces chip size. Furthermore, the reduced number of terminals and components allows the use of smaller and less expensive packages, which saves space and reduces the cost of power supply devices.

In addition, the threshold value for detecting an open or short error can be easily changed by changing the resistance value of the external resistor Rdet, thereby expanding the applications of the IC. Furthermore, the hysteresis circuits 17A and 17B are provided so that the comparators CMP1 and CMP2 can operate in hysteresis, preventing the current detection circuits 14A and 14B from malfunctioning due to noise. Moreover, hysteresis can be set separately for current detection circuits 14A and 14B.

Next, the specific circuits of the voltage converter 15 and hysteresis circuits 17A and 17B in the IC are described. First, as shown in FIG. 1, the above voltage converter 15 includes: a current buffer 15*a* composed of an amplifier AMP having its inverting input terminal connected to the above-mentioned external terminal P1 to which the resistor Rdet is connected and the reference voltage Vref applied to the non-inverting input terminal, and an NPN bipolar transistor Q0 having its emitter terminal connected to the external terminal P1, and having the inverting input terminal connected, and the output voltage of the amplifier AMP applied to the base terminal; a current mirror circuit 15*b* that folds back the current I1 generated by the current buffer 15*a* and fed into the resistor Rdet; and a resistor Rth that converts the current (transfer current) I2 of the secondary side of the current mirror circuit 15*b* to voltage, and the above voltage converter 15 is configured so that the voltage converted by the resistor R4 is supplied to the comparators CMP1 and CMP2 as the threshold voltage Vth for comparison judgment.

The current buffer 15*a* of the above voltage converter 15 has the output terminal of the above amplifier AMP connected to the base terminal of the NPN bipolar transistor Q0, and the emitter terminal of the transistor Q0 is connected to the inverting input terminal of the amplifier AMP. This allows the amplifier AMP to function as a voltage follower and operate the transistor Q0 so that the emitter voltage of the transistor Q0 (potential of external terminal P1) is equal to the input voltage of the non-inverting input terminal (reference voltage Vref).

The above amplifier AMP can be configured by a general differential amplifier circuit consisting of a constant current source (or resistor), a pair of load transistors, and a pair of differential input transistors with the above reference voltage Vref and the voltage Vdet of the external terminal P1 input to the base terminal, and it operates as a current buffer that flows a predetermined collector current in the transistor Q0.

On the other hand, the current mirror circuit 15*b* consists of a PNP bipolar transistor Q1 connected in series with Q0 at the collector terminal of the above transistor Q0, a PNP bipolar transistor Q2 connected in current mirror with the transistor Q1, and a resistor R4 connected at the collector terminal of the transistor Q2. The voltage obtained by the current-to-voltage conversion by the resistor R4 is supplied to the comparators CMP1 and CMP2 as the threshold voltage Vth. Therefore, the current buffer 15*a* and the transistors Q1 and Q2 that constitute the current mirror circuit 15*b* constitute a reference current generation circuit that generates a current that serves as a reference for comparison in the aforementioned current detection circuits 14a and 14b.

The characteristics of the above voltage converter 15 is described here.

In the voltage converter 15 of this embodiment, the voltage Vdet at the external terminal P1 is equal to the reference voltage Vref, or Vdet=Vref, due to the function of the current buffer 15a. Therefore, the current I1 that is flowed in the external resistor R4 by the current buffer 15a is as follows.

$$I1 = Vdet/Rdet = Vref/Rdet$$

Therefore, the comparison reference voltage Vth, which is converted and generated by the resistor R4 through which the current I2, with I1 folded back by the current mirror circuit 15b, flows, is expressed by the following equation (1) when the current mirror ratio is m.

$$Vth = R4 * I2 = R4 * I1/m \tag{1}$$

On the other hand, the output current Iout1 at the output terminal OUT1 is converted to the voltage Vout1' by flowing the current Iout1' generated by the current mirror (n) of the transistors Qp1 and Qs1 in the resistor R31. Therefore, when the ratio of Qp1 to Qs1 is n, it is expressed by the following equation (2).

$$Vout1' = R31 * Iout1' = R31 * Iout1/n \tag{2}$$

The comparator CMP1 detects the error by comparing the voltage given by the above equation (1) and the voltage given by equation (2). When the comparator CMP1 is used as a means of detecting open errors, the threshold voltage can be set by connecting the external resistor Rdet with a resistance value such that Vth=Vtho to the external terminal P1, and a regulator IC that detects an open state in the case of Vout1' Vtho can be realized. When the comparator CMP1 is used as a means of detecting short errors, the threshold voltage can be set by connecting an external resistor Rdet with a resistance value such that Vth=Vths to the external terminal P1, and a regulator IC that detects a short-circuit in the case of Vout1'≥Vths can be realized.

Here, since both internal resistors R31 and R4 of the IC are on-chip elements, the relative ratio is good (about ±0.5%), and the variation in temperature characteristics due to manufacturing variation is canceled.

On the other hand, the reference voltage Vref of the voltage converter 15 can generate a highly accurate reference voltage by band gap, or the like, and the external resistor Rdet is a discrete component with good accuracy and temperature characteristics (resistance accuracy of about ±1% and temperature characteristics of about ±100 ppm/° C.) that can be manufactured or obtained. Therefore, a highly accurate comparison reference voltage Vth can be set, and the accuracy of open or short error detection can be improved.

The output current Iout2 of the output terminal OUT2 is similar to the above, and the voltage converter 15 and the comparator CMP2 can detect open or short errors with high accuracy. If the loads connected to the output terminals OUT1 and OUT2 have the same characteristics and flow the same current, the same comparison reference voltage Vth can be used for the comparators CMP1 and CMP2. Thus, the voltage converter 15 can be shared like the regulator IC10 in this embodiment, and the comparison reference voltage Vth can be set by providing one external terminal P1 and one external resistor Rdet.

Next, the configuration and operation of the aforementioned hysteresis circuits 17A and 17B will be described.

The present inventors, in developing a regulator composed of bipolar transistors, examined hysteresis circuits suitable for bipolar circuits. However, although the method of switching the threshold voltage is relatively easy to implement to give hysteresis to the comparator, the method of switching the threshold voltage cannot be applied when a common error detection threshold is used for two channels, as in the invention of JP 2023-43049. Therefore, the present inventors considered a method of switching the input voltage or current on the other detection target side of the comparator.

Figure 8A:
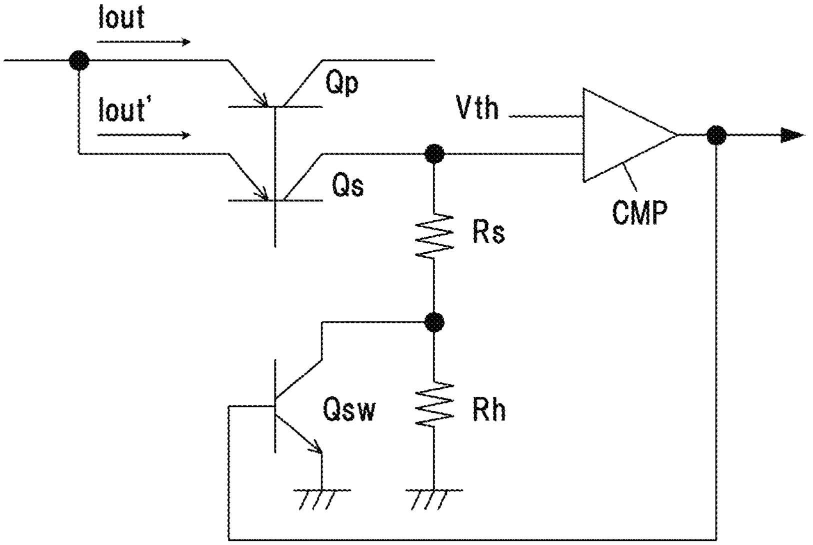
FIGS. 8A and 8B are circuit diagrams showing the configuration of the hysteresis circuit in the current detection circuit considered prior to the present disclosure.
Figure 8B:
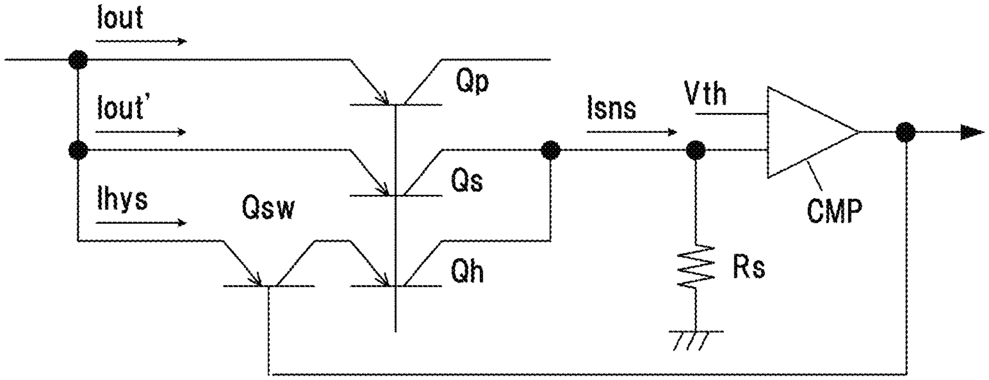

FIGS. 8A and 8B show the hysteresis circuit as originally conceived.

Of these, the circuit in FIG. 8A is a voltage-switching type hysteresis circuit having a resistor Rh for hysteresis in series with a sense resistor Rs that converts the proportional current Iout' of Iout into a voltage connected in series with a transistor Qp for output control that flows the output current Iout and a current mirror connected transistor Qs for detection current generation, and also providing a switch transistor Qsw is provided in parallel with the resistor Rh.

On the other hand, the circuit in FIG. 8B is a current-switching type hysteresis circuit with a transistor Qsw for switching and a transistor Qh for hysteresis, which are current-mirror-connected with transistor Qs, in parallel with transistor Qs for detection current generation that is current-mirror-connected with a transistor Qp for output control.

In both circuits of FIGS. 8A and 8B, the switching transistor Qsw is turned on or off by the output of the comparator CMP. This provides hysteresis to the current to be detected.

In the circuit of FIG. 8A, if the switching transistor Qsw is in the off state, the voltage is obtained by multiplying the current Iout' by the resistances of resistors Rs and Rh as the input voltage of comparator CMP. When the transistor Qsw is in an on state, the collector-emitter voltage of Qsw is ideally zero, and the input voltage of the comparator CMP is Iout'×Rs, which is the current Iout' multiplied by the resistance of the resistor Rs. However, the collector voltage is not Vsat or less because Qsw enters the saturation region at the transistor saturation voltage Vsat or less. Therefore, the input voltage of the comparator is not the current Iout' multiplied by the resistance of resistor Rs, but Iout'×Rs+Vsat.

On the other hand, in the circuit of FIG. 8B, the amount of current when transistors Qsw and Qh enter the saturation region is different from the amount of current in the active region, so the circuit no longer functions as a circuit that provides a specified hysteresis to the current to be detected. In regulators such as LDOs, the voltage between input and output is often used under conditions where the collector-emitter voltage of the output control transistor Qp is a small potential difference to increase power efficiency, and inevitably the collector-emitter voltage of the transistor Qs for generating detection current is also a small potential difference. Therefore, even in the hysteresis circuit of FIG. 8B, there is a very high possibility that transistors Qsw and Qh will operate in the saturation region.

As shown in FIG. 1, the hysteresis circuit 17A in the regulator IC in this example includes: PNP bipolar transistors Qh11 and Qh21, which constitute a current mirror circuit with the transistors Qp1 and Qs1 constituting the current detection circuit 14A, and NPN bipolar transistors Qh41 and Qh31 connected in series with the transistors Qh11 and Qh21 respectively. The transistors Qh31 and Qh41 are coupled base to base to form a current mirror circuit, and the base terminal and collector terminal of Qh31 are coupled. A switch transistor Qsw1 for hysteresis switching is connected between the common base terminals of transistors Qh31 and Qh41 and the ground point, and the output voltage of the corresponding comparator CMP1 is applied to the base terminal of the transistor Qsw1.

In the hysteresis circuit 17A having the above configuration, when the transistor Qsw1 for switching is in an on state, the current Isns1 flowing in the resistor R31 is Isns1=Iout1'+Ihys11 when the current flowing in the transistor Qh11 is 10'Ihys11. The output of comparator CMP1 is input to the base terminal of transistor Qsw1, which switches Qsw1 to the off state when a detection operation is performed. And if the current flowing in the transistor Qh21 is Ihys21, the current flowing in the resistor R31 is Isns1=Iout1'+Ihys11−Ihys21 when Qsw1 is in an off state.

Therefore, when the current detection circuit is used as an open error detection circuit, the open state is detected when Vth≤R31×(Iout1'+Ihys11−Ihys21) and the open state detection is released when Vth≥R31×(Iout1'+Ihys11). On the other hand, when the current detection circuit is used as short-circuit detection, the short state is detected when Vth≥R31×(Iout1'+Ihys11), and the short state detection is released when Vth≤R31×(Iout1'+Ihys11−Ihys21).

By operating as described above, the detection current value when performing the detection and release operations of the comparator CMP1 is different, which is the same as relatively switching the threshold voltage Vth, thus providing hysteresis to current detection circuit 14A. The width of hysteresis can be changed by adjusting the mirror ratio of transistors Qh31 and Qh41, which constitute the current mirror.

The aforementioned hysteresis circuit 17B, which is provided corresponding to the other current detection circuit 14B composed of the transistor Qs2, resistor R32 and comparator CMP2, has the same configuration as the hysteresis circuit 17A and performs the same operation as above.

As noted above, in the circuit of FIG. 8B, since the configuration is to turn on and off the current of the hysteresis transistor Qh directly, the transistor operates in the saturation region and the desired hysteresis cannot be given to the current to be detected.

In contrast, according to the hysteresis circuit 17A in this example, which is configured as described above, by the action of the transistors Qh31 and Qh41, which transfer the current of transistors Qh21 and Qh21 as a current source with a current mirror, and the transistor Qsw, which is responsible for stopping the current flowing in Qh31 and Qh41, Qh11 and Qh21 do not operate in the saturation region, Thus, the desired current hysteresis can be given. This is also true for the hysteresis circuit 17B. When the regulator IC10 of FIG. 1 is composed of MOS transistors, there is no saturation problem. Thus, the hysteresis circuit may be a hysteresis circuit with the configuration shown in FIG. 8B.

In the example regulator IC 10 shown in FIG. 1, when the value of the threshold voltage Vth is low (for example, when the value of Vth is set low for open error detection), the current detection circuits 14A and 14B operate with the upper end value of the voltage converted by the resistors R31 and R32 also low. In such a case, the collector-emitter voltage of transistors Qh41 and Qh42 may be insufficient to operate in the saturation region. Therefore, an example regulator IC with the countermeasure is shown in FIG. 2.

Figure 2:
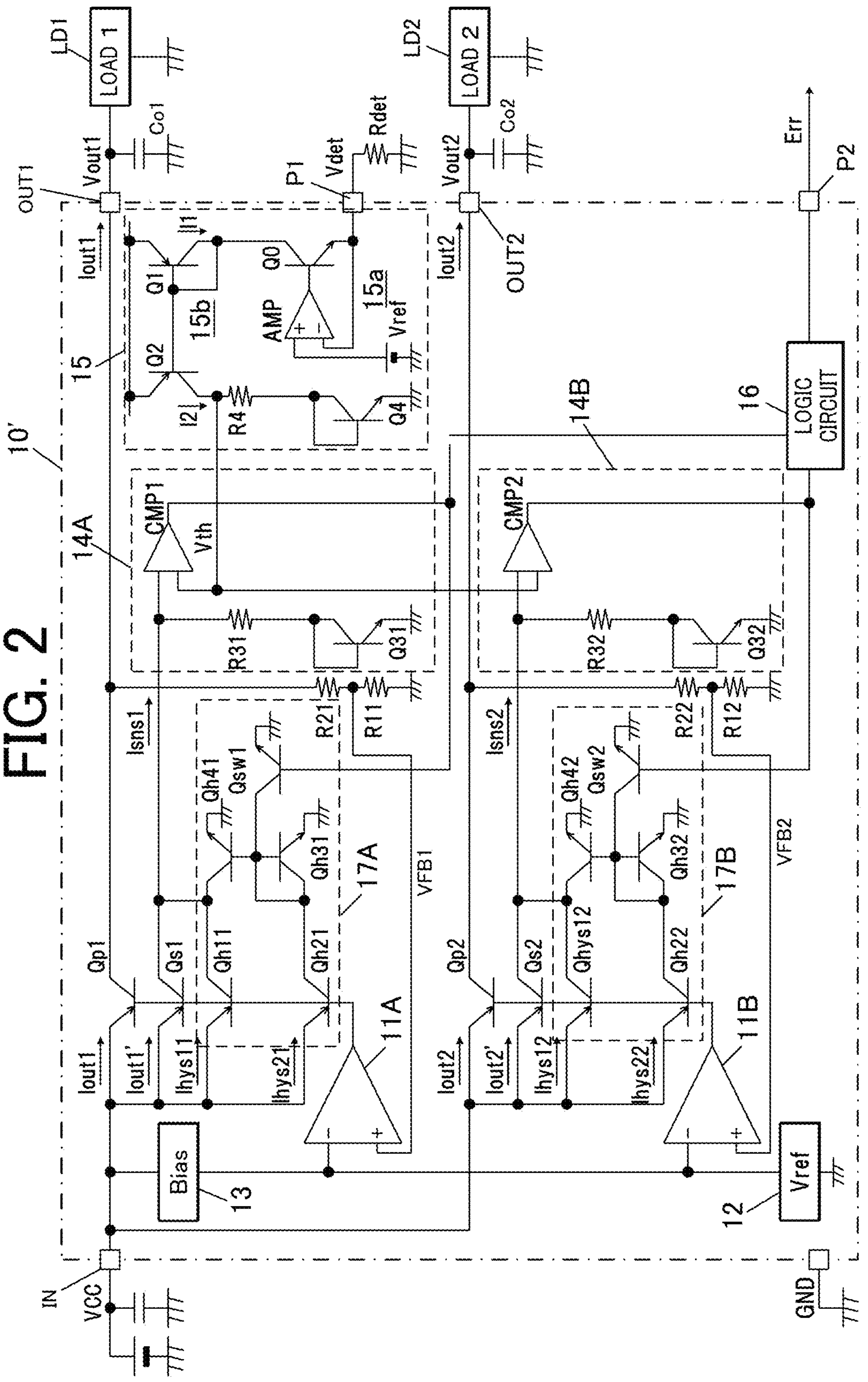
FIG. 2 is a circuit diagram showing a second example of a regulator IC of the first embodiment applying the present disclosure.

In the second example regulator IC10' shown in FIG. 2, NPN transistors Q31 and Q32, whose collectors and bases are coupled and function as diodes, are placed between resistors R31 and R32 for current-to-voltage conversion of the current detection circuits 14A and 14B and the ground point in the first example regulator IC shown in FIG. 1, and the NPN transistors Q31 and Q32 are installed in series with the resistors R31 and R32. The diode-connected NPN transistor Q4 is installed in series with the resistor R4 between the resistor R4 and the ground point on the secondary side of the voltage converter 15. A diode element may be used instead of the transistors Q31, Q32, and Q4.

In the second example regulator IC 10', the diode-connected transistors Q31 and Q32 do not allow the input voltages of comparators CMP1 and CMP2 (detection voltage converted by resistors R31 and R32) to fall below the threshold voltage of the NPN transistors. This ensures that the collector-emitter voltage of transistors Qh41 and Qh42 is sufficient and that Qh41 and Qh42 do not operate in the saturation region.

The diode-connected transistor Q4 in the voltage converter 15 prevents the potential difference between the input voltages of comparators CMP1 and CMP2 and the threshold voltage Vth generated by the voltage converter 15 from changing before and after the transistors Q31 and Q32 are installed. Along with this, even if the base-emitter voltages of transistors Q31 and Q32 differ from IC to IC due to manufacturing variations, the same variation in the base-emitter voltage of transistor Q4 can avoid reduction of the detection accuracy.

However, since the circuit in FIG. 2 is in the form of lifting the input voltage of comparators CMP1 and CMP2 by the voltage in the forward direction of the base-to-emitter PN junction diodes generated in NPN transistors Q4, Q31, and Q32, it is desirable that the respective base-emitter voltages of Q4, Q31 and Q32 are be the same. It is then important to match the ratio of the current flowing in the transistors Q4, Q31, and Q32 to the drive capability in order to keep the base-emitter voltage the same. In addition, since the drive capability of transistors varies depending on the manufacturing process, consideration need be given to variations such as placing each transistor in close proximity to the other.

Figure 3:
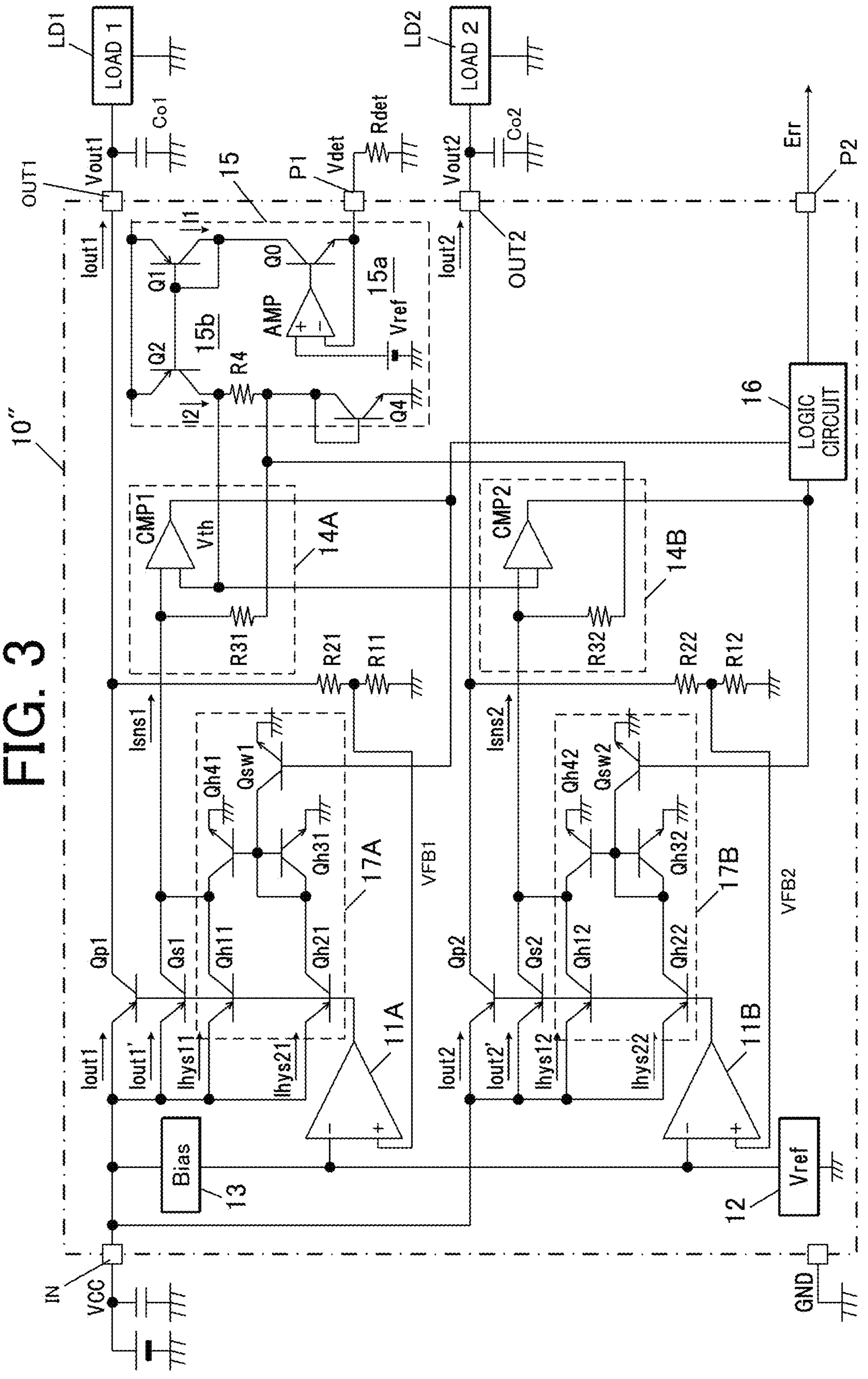
FIG. 3 is a circuit diagram showing a third example of a regulator IC of the first embodiment applying the present disclosure.

An example regulator IC with the above countermeasures against variation is shown in FIG. 3.

In the third example regulator IC 10" shown in FIG. 3, for the purpose of sharing the diode-connected transistors Q4, Q31, and Q32 in series with the current-to-voltage conversion resistors R4, R31, and R32 in the second example regulator IC shown in FIG. 2, Q31 and Q32 are omitted and only Q4 is provided. The terminals on the ground point side of resistors R4, R31, and R32 are connected to the collector terminal side of diode-connected transistor Q4, so that all current flowing in the resistors R4, R31, and R32 flows in the transistor Q4.

In the third example of regulator IC10", the diode-connected transistor for preventing saturation is shared by the resistors R4, R31, and R32, so that a difference in base-emitter voltage as in the second example cannot inevitably occur. The thresholds for the detection and release operations of comparator CMP1 are determined by comparing the voltage of resistor R4×current I2 and resistor R31×Isns1, and the thresholds for the operation and release operations of comparator CMP2 are determined by comparing the voltage of resistor R4×current I2 and resistor R32×Isns2. Therefore, it is possible to realize a current detection circuit that is not dependent on the variation of diode-connected transistors. However, because current detection circuits 14A and 14B share diode-connected transistors, crosstalk may occur as a result of the operation of one current detection circuit, which affects the other.

Second Embodiment

Figure 4:
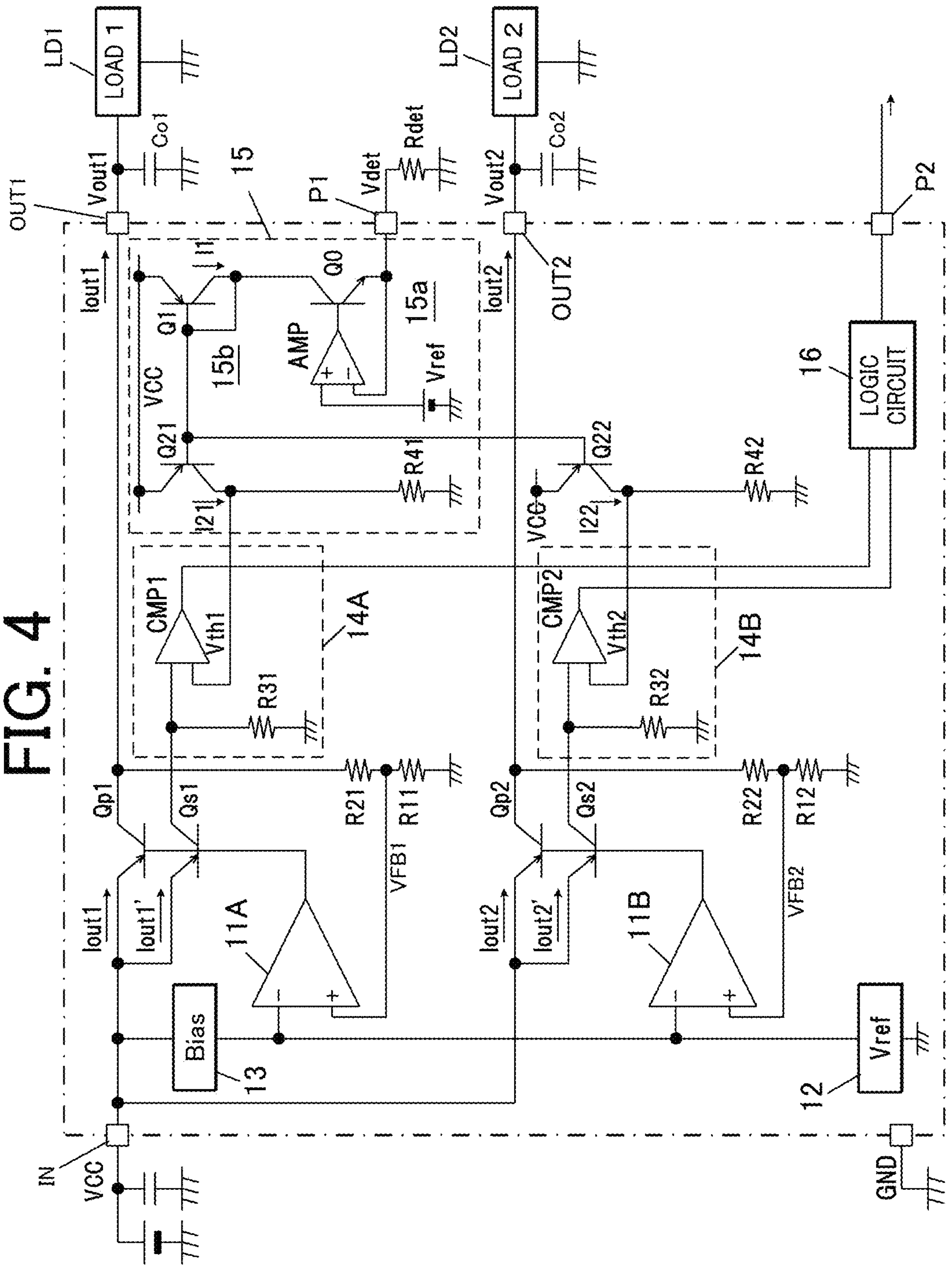
FIG. 4 is a circuit diagram showing the basic configuration of the regulator IC of a second embodiment applying the present disclosure.

Next, the second embodiment of the application of the present disclosure to a series regulator is described. FIG. 4 shows the basic circuit configuration of the regulator IC of the second embodiment. FIG. 4 shows the basic circuit configuration of the regulator IC before providing hysteresis to the comparison operation of comparators CMP1 and CMP2, which constitute current detection circuits 14A and 14B. An example of a circuit that provides hysteresis to this basic circuit is shown in FIGS. 5 to 7.

Figure 5:
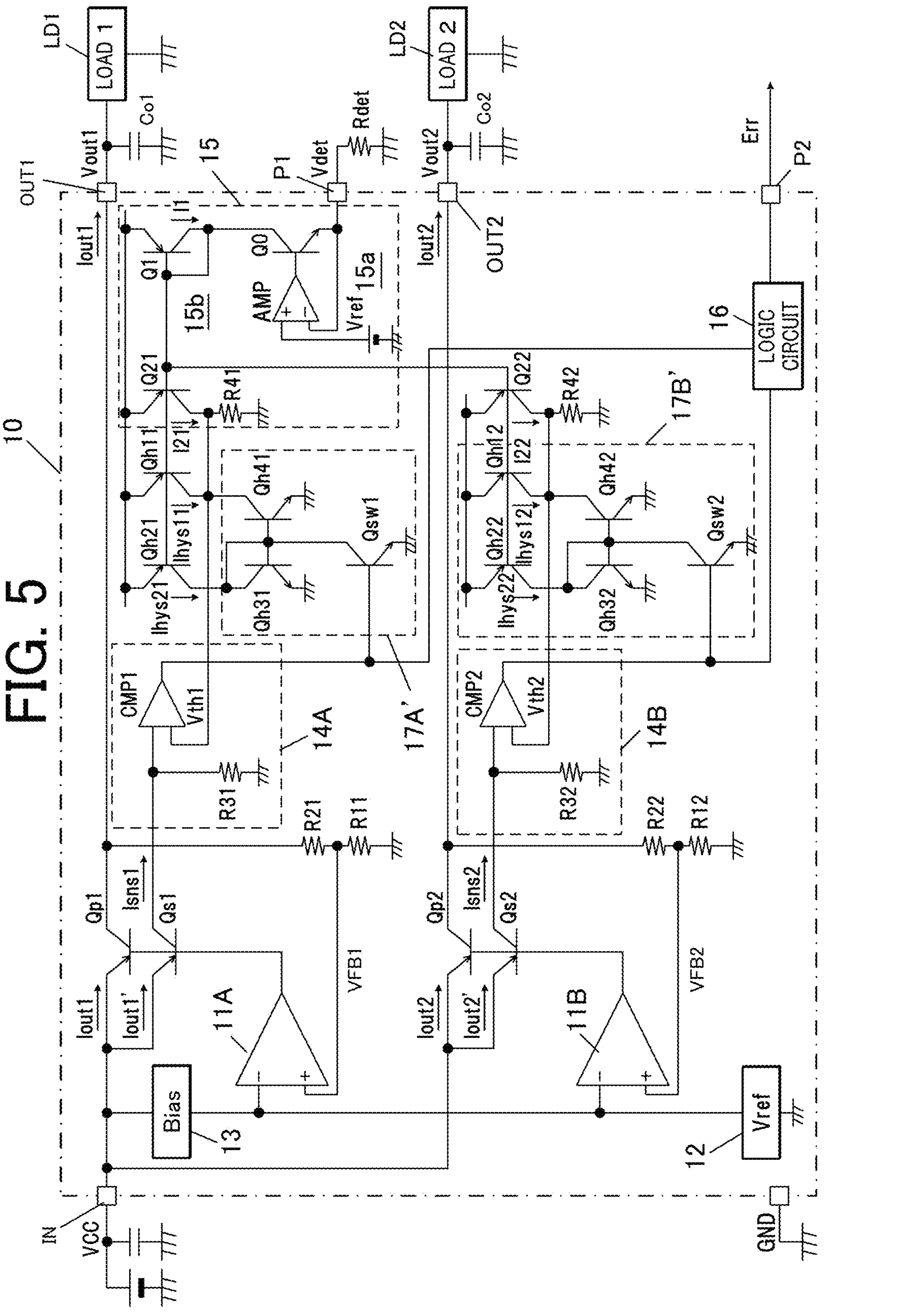
FIG. 5 is a circuit diagram showing a first example of a regulator IC of the second embodiment applying the present disclosure.
Figure 6:
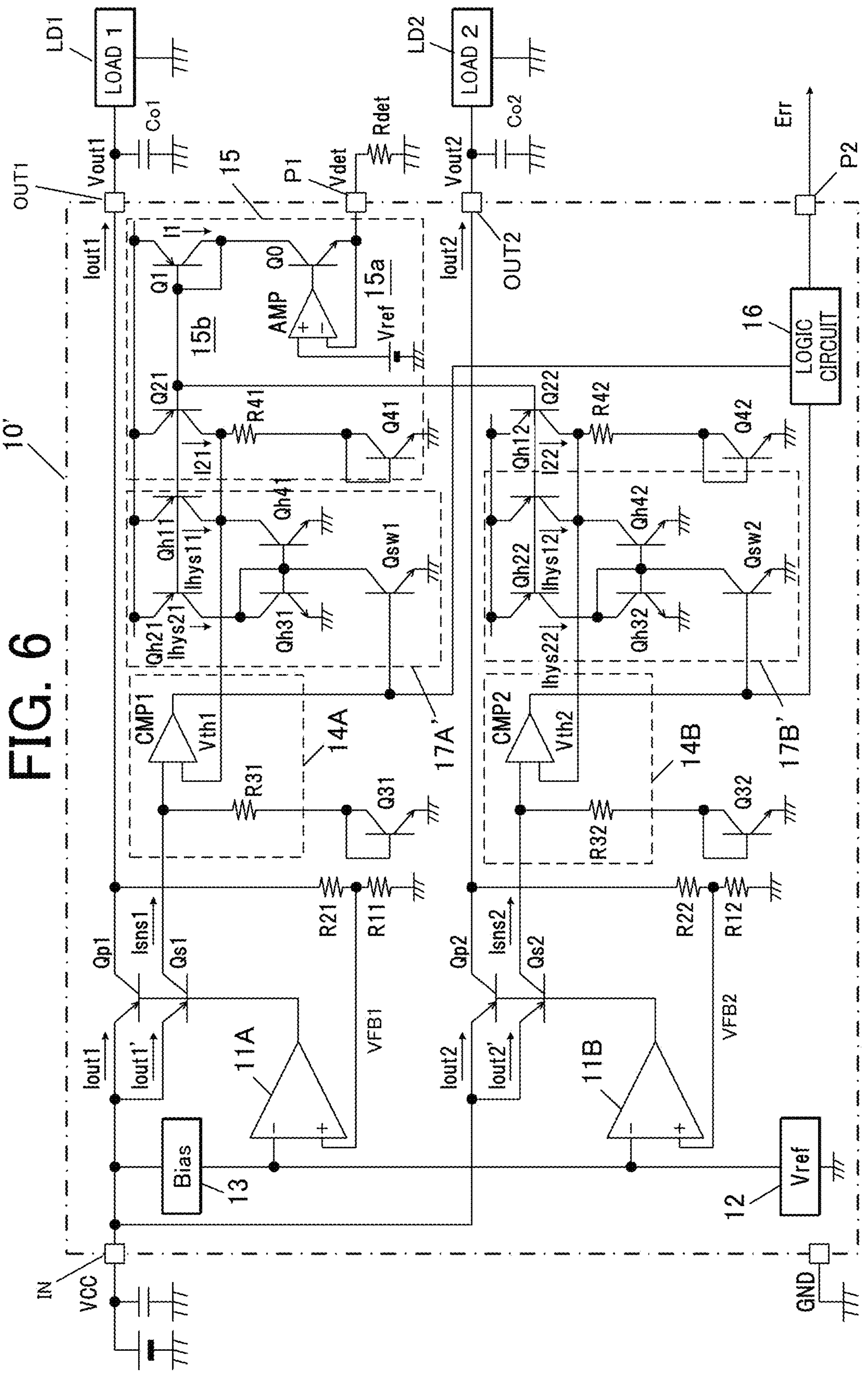
FIG. 6 is a circuit diagram showing a second example of a regulator IC of the second embodiment applying the present disclosure.
Figure 7:
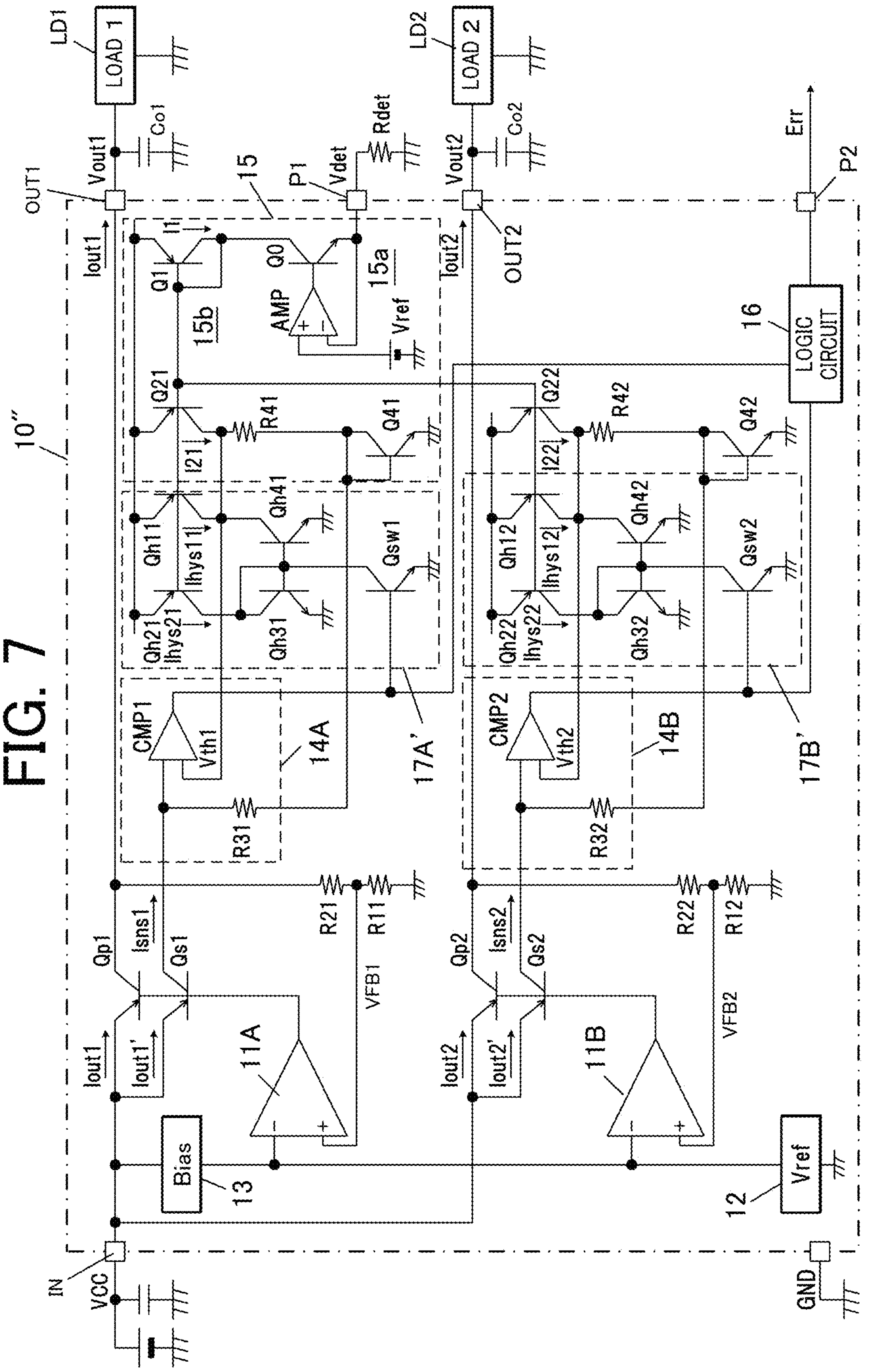
FIG. 7 is a circuit diagram showing a third example of a regulator IC of the second embodiment applying the present disclosure.

In the first embodiment above, hysteresis is applied to the current side to be detected of the current detection circuits 14A and 14B, whereas the regulator in the second embodiment example shown in FIGS. 5 to 7 is characterized in that the circuit on the side that generates the threshold voltage Vth, which is the reference for comparison judgment, is formed by a current mirror circuit, and hysteresis is given to the current flowing in the secondary side of the current mirror circuit. The basic configuration of the circuit that provides hysteresis is the same for both the first and second embodiments.

The regulator IC shown in FIG. 4 has a transistor Q21 on the secondary side that constitutes the current mirror circuit 15*b* of the voltage converter circuit 15 and a resistor R41 that converts the current I21 of the above into a voltage, as well as a transistor Q22 that constitutes the current mirror circuit with the transistor Q1 on the primary side and a resistor R42 that converts the current I22 into a voltage. The voltage converted by the resistor R41 is supplied to the comparator CMP1 of current detection circuit 14A as a threshold voltage Vth1 for comparison judgment, and the voltage converted by the resistor R42 is supplied to the comparator CMP2 of current detection circuit 14B as a threshold voltage Vth2 for comparison judgment. Vth1 and Vth2 are independent of each other and can be set to different potentials, but may be the same voltage value.

In the regulator IC10 shown in FIG. 5, the hysteresis circuits 17A' and 17B' are provided to provide hysteresis to the comparators CMP1 and CMP2 by varying the threshold voltages Vth1 and Vth2 for comparison judgment in the regulator IC of FIG. 4. The configuration of hysteresis circuits 17A' and 17B' is the same as that of the hysteresis circuits 17A and 17B shown in FIG. 1.

Among these, the hysteresis circuit 17A' consists of a transistor Q21, which constitutes a current mirror with a transistor Q1 on the primary side of the current mirror circuit 15*b*, transistors Qh11 and Qh21, which are also connected to Q1 in a current mirror, current mirror transistors Qh41 and Qh31 connected in series with Qh11 and Qh21, and a switching transistor Qsw1 connected between the common base terminal of Qh41 and Qh31 and the ground point, so that Qsw1 is turned on and off by the output of comparator CMP1.

In the regulator IC10 shown in FIG. 5, for example, Vth1=R42×(I21+Ihys11) when Qsw1 is in an on state and Vth1=R42×(I21+Ihys11−Ihys21) when Qsw1 is in an off state, enabling providing hysteresis to the comparator CMP 1 by changing the threshold voltage Vth1. The same is true for the other hysteresis circuit 17B' that provides hysteresis to the comparator CMP2 of the current detection circuit 14B.

Also, when the threshold voltages Vth1 and Vth2 are set to low values, the transistors Qh41 and Qh42 constituting the hysteresis circuits 17A' and 17B' may operate in the saturation region, which is the same concern as the hysteresis circuits 17A and 17B in the regulator IC 10 shown in FIG. 1, and the regulator IC 10' with the countermeasure is shown in FIG. 6.

In the regulator IC 10' of FIG. 6, in series with the resistors R41 and R42 for current-to-voltage conversion of the voltage converter 15 and the resistors R31 and R32 for current-to-voltage conversion of the current detection circuits 14A and 14B, respectively diode-connected transistors Q41 and Q31 and Q42 and Q32 are provided.

In addition, an example regulator IC with countermeasures against the variation of the transistor of the diode connection in the regulator IC 10' of FIG. 6 is shown in FIG. 7.

In the regulator IC10" shown in FIG. 7, the diode-connected transistors Q41 and Q31 in FIG. 6 are common, and transistors Q42 and Q32 are common.

Again, in this example, as in the example shown in FIG. 6, transistor Q41 is provided in common diode connection with resistors R31 and R41 for current-to-voltage conversion, and transistor Q42 is provided in common diode connection with resistors R32 and R42, thereby avoiding problems caused by transistor variation and The transistors Qh41, Qh31 and Qh42, Qh32, which constitute the hysteresis circuits 17A', 17B', can be prevented from operating in the saturation region.

Also, since the regulator IC of the second embodiment shown in FIGS. 5 to 7 generates the threshold voltages Vth1 and Vth2 for comparison judgment used for comparators CMP1 and CMP2 separately, the problem of cross-talk between the current detection circuits 14A and 14B in the regulator IC of the first embodiment also does not occur.

The above is specific explanation of some aspects of the present disclosure based on embodiments, but the present disclosure is not limited to the aforementioned embodiments. For example, in the above embodiments, a bipolar transistor is used as a transistor that constitutes the internal circuit of the regulator IC 10, but as for the first example of the first embodiment (FIG. 1) and the first example of the second embodiment (FIG. 5), MOS transistors may be used instead of bipolar transistors.

In the above-mentioned embodiments, the case of a regulator IC with a two-channel configuration having two output terminals is described, but the number of channels is not limited to two and can be three or more. Especially in the case of three or more channels, the signal indicating that an error has been detected output from the logic circuit 16 may be configured to be output as a signal of two or more bits.

Furthermore, in the regulator IC of the above embodiments, the explanation assumes the case where it is configured as a power supply device for in-vehicle terrestrial digital broadcasting with an antenna connected to the output terminal OUT as a load, but the load is not limited to an antenna and can be applied to a power supply device to which two or more loads with the same current consumption are connected.

In the above embodiments, the case where the present disclosure is applied to a regulator IC that constitutes a linear regulator such as an LDO is described. However, the present disclosure is not limited to regulator ICs, but can also be applied to ICs that constitute switching regulator type DC-DC converters and high-side switch ICs.

According to an aspect of the present disclosure, there is provided a current detection circuit including: a current-to-voltage converter that converts a current to be detected or a reference current into a voltage; a comparator including one input terminal to which a voltage that is current-to-voltage converted by the current-to-voltage converter is input and the other input terminal to which a voltage as a reference for comparison or a voltage converted from the current to be detected is input; and a hysteresis circuit for providing hysteresis to a comparison operation of the comparator, wherein the hysteresis circuit includes: a current source circuit that generates a current of a predetermined magnitude; and a switch connected in series with the current source circuit, and the switch is switched to an on state or an off state by an output of the comparator, thereby a current flowed in the current-to-voltage converter is increased or decreased by an amount of the current of the current source circuit, and the voltage converted from the current to be detected or the voltage converted from the reference current changes and thereby the hysteresis circuit provides hysteresis to the comparison operation of the comparator.

According to the current detection circuit having the above configuration, hysteresis can be provided to the comparison operation of the comparator whose detection target is a current.

According to an aspect of the present disclosure, it is possible to provide a current detection circuit and a power supply semiconductor integrated circuit incorporating the same, which can provide hysteresis to the comparison operation of the comparator whose detection target is a current. There is also an effect that, in a power supply semiconductor integrated circuit having a current detection circuit that detects an open state or a short state of an output terminal using a comparator and composed of bipolar transistors, it is possible to prevent the transistor that constitutes the hysteresis circuit in the current detection circuit from operating in the saturation region.

Although embodiments of the present invention have been described and illustrated in detail, the disclosed embodiments are made for purposes of illustration and example only and not limitation. The scope of the present invention should be interpreted by terms of the appended claims.

The invention claimed is:

1. A current detection circuit comprising:

a current-to-voltage converter that converts a current to be detected or a reference current into a voltage;

a comparator including one input terminal to which a voltage that is current-to-voltage converted by the current-to-voltage converter is input and the other input terminal to which a voltage as a reference for comparison or a voltage converted from the current to be detected is input; and a hysteresis circuit for providing hysteresis to a comparison operation of the comparator, wherein the hysteresis circuit includes:

a current source circuit that generates a current of a predetermined magnitude; and a switch connected in series with the current source circuit, and the switch is switched to an on state or an off state by an output of the comparator, thereby a current flowed in the current-to-voltage converter is increased or decreased by an amount of the current of the current source circuit, and the voltage converted from the current to be detected or the voltage converted from the reference current changes and thereby the hysteresis circuit provides hysteresis to the comparison operation of the comparator.

2. The current detection circuit according to claim 1, wherein the current to be detected or the reference current is flowed in the current-to-voltage converter by a first transistor, the hysteresis circuit includes:

a second transistor and a third transistor each of which includes a control terminal and flows a current proportional to a current of the first transistor, the control terminal being a terminal to which a same voltage as a voltage applied to a control terminal of the first transistor is applied; and a fourth transistor and a fifth transistor that are connected in series with the second transistor and the third transistor respectively, and the fourth transistor and the fifth transistor include control terminals coupled together to form a current mirror circuit, and the switch is connected between a reference potential point and a coupling node of the control terminals of the fourth transistor and the fifth transistor.

3. The current detection circuit according to claim 2, wherein the first through fifth transistors include bipolar transistors, and a PN junction rectifier is connected between the switch and the reference potential point in a forward direction toward the reference potential point.

4. A power supply semiconductor integrated circuit, comprising:

one input terminal and a plurality of output terminals;

a plurality of current control transistors connected respectively between the input terminal and the plurality of output terminals;

a control circuit for controlling the plurality of current control transistors;

a plurality of current detection circuits that detect an open state or a short state of the respective plurality of output terminals by converting each of a current and a predetermined reference current into a voltage and comparing the voltage, the current being proportional to a current flowed in the plurality of output terminals by the plurality of current control transistors;

an external terminal for connecting an external resistor; and a reference current generation circuit that generates the reference current in accordance with a voltage of the external terminal generated by flowing a current in the external resistor, wherein each of the plurality of current detection circuits includes:

a first transistor including a control terminal to which a same voltage as a voltage applied to a control terminal of the current control transistor is applied;

a first current-to-voltage converter that converts a current flowing in the first transistor into a voltage;

a comparator including one input terminal to which a detection voltage converted by the first current-to-voltage converter is input and the other input terminal to which the voltage that is current-to-voltage converted from the reference current is input as a comparison reference voltage; and a hysteresis circuit for providing hysteresis to a comparison operation of the comparator, the hysteresis circuit includes:

a current source circuit that generates a current of a predetermined magnitude that is added to or subtracted from the current flowing in the first transistor; and a switch connected in series with the current source circuit, and the switch is switched to an on state or an off state by an output of the corresponding comparator, thereby a current flowing in the first current-to-voltage converter is increased or decreased by an amount of the current of the current source circuit, and the detection voltage changes relative to the comparison reference voltage and thereby the hysteresis circuit provides hysteresis to the comparison operation of the comparator.

5. The power supply semiconductor integrated circuit according to claim 4, wherein the hysteresis circuit includes:

a second transistor and a third transistor each of which includes a control terminal and flows a current proportional to a current of the first transistor, the control terminal being a terminal to which a same voltage as a voltage applied to the control terminal of the first transistor is applied; and a fourth transistor and a fifth transistor that are connected in series with the second transistor and the third transistor respectively, and the fourth transistor and the fifth transistor include control terminals coupled together to form a current mirror circuit, and the switch is connected between a reference potential point and a coupling node of the control terminals of the fourth transistor and the fifth transistor.

6. The power supply semiconductor integrated circuit according to claim 5, wherein the first through fifth transistors include bipolar transistors, and a PN junction rectifier is connected between the reference potential point and the first current-to-voltage converter included in each of the plurality of current detection circuits in a forward direction toward the reference potential point.

7. The power supply semiconductor integrated circuit according to claim 6, further comprising:

a voltage-current conversion circuit that generates a current according to the voltage of the external terminal or an external resistor connected to the external terminal;

a current mirror circuit that transfers the current generated by the voltage-current conversion circuit; and a second current-to-voltage converter that converts an output current of the current mirror circuit into a voltage, wherein the voltage converted by the second current-to-voltage converter is supplied to the plurality of current detection circuits as the comparison reference voltage, and a common PN junction rectifier is connected between converters and the reference potential point in a forward direction toward the reference potential point, the converters being the first current-to-voltage converter and the second current-to-voltage converter.

* * * * *